United States Patent
Edgley

(10) Patent No.: US 11,454,683 B2
(45) Date of Patent: Sep. 27, 2022

(54) ANOMALY DETECTION AND CORRELATION SYSTEM

(71) Applicant: Siemens Healthcare Limited, Camberley (GB)

(72) Inventor: Paul William Edgley, Oxfordshire (GB)

(73) Assignee: Siemens Healthcare Limited, Camberley (GB)

(*) Notice: Subject to any disclaimer, the term of this patent is extended or adjusted under 35 U.S.C. 154(b) by 0 days.

(21) Appl. No.: 17/289,043

(22) PCT Filed: Oct. 18, 2019

(86) PCT No.: PCT/EP2019/078464
§ 371 (c)(1),
(2) Date: Apr. 27, 2021

(87) PCT Pub. No.: WO2020/088959
PCT Pub. Date: May 7, 2020

(65) Prior Publication Data
US 2021/0405135 A1     Dec. 30, 2021

(30) Foreign Application Priority Data

Oct. 29, 2018   (GB) ..................... 1817592

(51) Int. Cl.
*G01R 33/28*      (2006.01)
*G01R 33/34*      (2006.01)
(Continued)

(52) U.S. Cl.
CPC ..... *G01R 33/288* (2013.01); *G01R 33/34023* (2013.01); *G01R 33/3815* (2013.01); *H01F 6/02* (2013.01)

(58) Field of Classification Search
CPC ............ G01R 33/288; G01R 33/34023; G01R 33/3815; G01R 33/36; G01R 3/20;
(Continued)

(56) References Cited

U.S. PATENT DOCUMENTS 5,332,969 A    7/1994  Tsuruno et al.
6,380,738 B1   4/2002  Zhou
(Continued)

FOREIGN PATENT DOCUMENTS

EP    0351430 A1    1/1990
EP    0579133 A1    1/1994
(Continued)

OTHER PUBLICATIONS

X. Huang, A. Wu, M. Xu, X. Chu, C. Yang and Y. Zhao, "An Active Quench Protection System for MRI Magnets," in IEEE Transactions on Applied Superconductivity, vol. 20, No. 3, pp. 2091-2094, Jun. 2010 (Year: 2010).*

(Continued)

*Primary Examiner* — Daniel R Miller
(74) *Attorney, Agent, or Firm* — Banner & Witcoff Ltd.

(57) ABSTRACT

An anomaly detection system comprising a diagnostic interface and a data acquisition system capable of recording data indicating variation of voltages at tapping points in a superconducting magnet. Data representing those variations in voltages may be stored as a data log and a processor may analyze the data in order to identify a mechanical impact.

11 Claims, 5 Drawing Sheets

(51) Int. Cl.
*G01R 33/3815* (2006.01)
*H01F 6/02* (2006.01)

(58) Field of Classification Search
CPC .......... H01F 6/02; H02H 7/001; H02H 9/041; Y02E 40/60
See application file for complete search history.

(56) References Cited

U.S. PATENT DOCUMENTS

| | | |
|---|---|---|
| 10,082,547 B2 | 9/2018 | Piron et al. |
| 2007/0194790 A1 | 8/2007 | Graessner |
| 2007/0228264 A1 | 10/2007 | Li |
| 2008/0164877 A1 | 7/2008 | Huang et al. |
| 2010/0253373 A1 | 10/2010 | Kawashima |
| 2013/0154648 A1 | 6/2013 | Shen et al. |
| 2013/0293987 A1 | 11/2013 | Joshi |
| 2018/0052210 A1* | 2/2018 | Piron .................. G01R 33/288 |

FOREIGN PATENT DOCUMENTS

| | | |
|---|---|---|
| JP | 5770414 A | 4/1982 |
| JP | H06186268 A | 7/1994 |
| JP | 2006034528 A | 2/2006 |
| WO | 2004070412 A1 | 8/2004 |

OTHER PUBLICATIONS

Patent Cooperation Treaty Search Report dated Feb. 10, 2020, Application No. PCT/EP2019/078464.
GB Search Report dated Jul. 19, 2019, Application No. GB1817592.7.

* cited by examiner

ANOMALY DETECTION AND CORRELATION SYSTEM

CROSS-REFERENCE TO RELATED APPLICATIONS

The present application is a national stage entry of PCT application no. PCT/EP2019/078464, filed on Oct. 18, 2019, which claims the benefit of the filing date of Great Britain patent application no. GB 1817592.7, filed on Oct. 29, 2018, the contents of each of which are incorporated herein by reference in their entireties.

TECHNICAL FIELD

The present disclosure relates to anomaly detection for fault evaluation in relation to high-strength magnet systems. An example of such magnet system is a Magnetic Resonance Imaging (MRI) system, for example using a superconducting magnet. Such system will be considered in more detail in the following description, but the present disclosure may be applied in analogous manner to other magnet systems.

BACKGROUND

It is an inherent hazard of MRI systems that utilize superconducting magnets that, due to the continuous presence of a strong magnetic field (typically 1.5 T or 3.0 T), that ferromagnetic objects inadvertently brought into proximity of the magnet will be violently attracted to the magnet potentially causing damage. Typically, great care is taken in the preparation and control of patients in the presence of these magnetic fields. Radiologists and technicians are trained and experienced in working within this environment.

Conventionally, primary measures in place to reduce the likelihood of damage from impacts of ferromagnetic objects are preventative, such as in training staff. Metal detector systems are available as a pre-scan check, but these are typically focused towards patients, who are closely supervised in any event.

However, use of and access to the environment around the MRI system is typically less well controlled for routine cleaning and maintenance activities. It has been known for ferromagnetic objects such as floor cleaning machines, maintenance tools etc. to be violently attracted to the magnet, causing damage to the magnet.

Impacts resulting from such incidents may cause damage to occur to the magnet in a number of ways, either through direct damage to the outer covers, or parts of the vacuum vessel that surround the magnet; through the distortion of internal parts such as suspension elements, which distortion may lead to cryogenic heat loads resulting in cryogen loss; or damage may occur to internal vessel or magnet components due to the strong forces involved.

SUMMARY

The present disclosure provides methods and apparatus for identifying and classifying anomalies caused by objects which could cause damage to the magnet. Such anomalies include mechanical impacts and also interference in an imaging magnetic field by an unexpected object in proximity to the imaging system. In considering the effect of a certain object attracted towards the magnet, a total mass of the object and a ferromagnetic mass of the object both contribute to the damage caused by the object. For example, a 4 kg tool box may comprise almost 4 kg of ferromagnetic material, while a 10 kg wheelchair may comprise only 1 kg ferromagnetic material. The force on the object will be determined by its ferromagnetic mass, but the damage caused will depend on the object's kinetic energy on impact, which will be determined by the total mass of the object and its velocity on impact. The velocity on impact will be determined by the force on the object (a function of the ferromagnetic mass) and its resulting acceleration (which is a function also of the total mass).

In case of impact to a magnet system, disputes may occur regarding warranty or service claims between a system user and the system manufacturer or other service organisation. Without direct evidence of a root cause, such as impact by an object, unnecessary financial losses may be incurred by the manufacturer or other service organisation. The present disclosure provides methods and equipment for identifying incidents of impact to magnet systems such as MRI systems.

For example, a manufacturer may guarantee a system against damage from impacts by objects having a total mass of no more than a threshold value mass, such as 10 kg. If the manufacturer can show, for example by using a system or method of the present disclosure, that a magnet system has suffered an impact by an object, then any resulting damage may be excluded from warranty cover. Further, an estimate of the magnitude of an impact, as may be provided by the systems and methods of the present disclosure, may allow an estimate of likely damage to be performed in advance, such that an appropriate service schedule may be planned. In some examples of the disclosure, it may be possible to estimate the likely impact position on the magnet system, and so to have some idea of what type of damage to expect, which will improve the effectiveness of a service intervention.

In other detectable anomalies, no mechanical impact may result, and there may be no damage to the imaging system. However, proximity of an unexpected article may result in deformation of an imaging magnetic field which may result in a service call. If it could be shown that the deformation suddenly arose, and the magnitude and timing of the deformation are recorded, it may be possible to show that the deformation was due to the inappropriate placement of an article in the vicinity of the imaging system. In that case, it may be possible to identify and remove the corresponding article, or at least to avoid a warranty service call.

US2013/0293987 Brookhaven Science Associates LLC describes a quench detection system for superconducting magnets. A data acquisition system for the detection and active propagation of quenches in high temperature superconducting leads is described.

US10082547 B2 SYNAPTIVE MEDICAL BARBADOS INC describes an arrangement in which MR-incompatible objects are detected and the strength of a magnetic field is reduced if the MR-incompatible objects are determined as posing an operational hazard.

US 2007/194790 A1 GRAESSNER JOACHIM describes a detection device for automatic detection of an object attracted onto or into magnetic resonance apparatus due to interaction with the magnetic field.

JP 2006 034528 A GE MED SYS GLOBAL TECH CO LLC describes a magnetic resonance imaging system with a vibration detector and compensation arrangement.

DESCRIPTION OF THE ACCOMPANYING DRAWINGS

The above, and further, objects, characteristics and advantages of the present disclosure may be better understood by reference to the following description of certain embodiments thereof, given by way of examples only, in conjunction with the accompanying drawings, wherein.

DETAILED DESCRIPTION

In an embodiment of the disclosure, a diagnostic interface is connected to voltage tap points provided in the circuit of a superconducting magnet between superconducting coils. In an example embodiment, such a diagnostic interface comprises a network of resistors and voltage limiters such as voltage dependent resistors or transorbs (transient voltage suppression diodes).

The diagnostic interface may be enclosed within the cryogen vessel of the magnet system and is electrically connected to a data acquisition system which may be external to the cryogen vessel.

Figure 1:
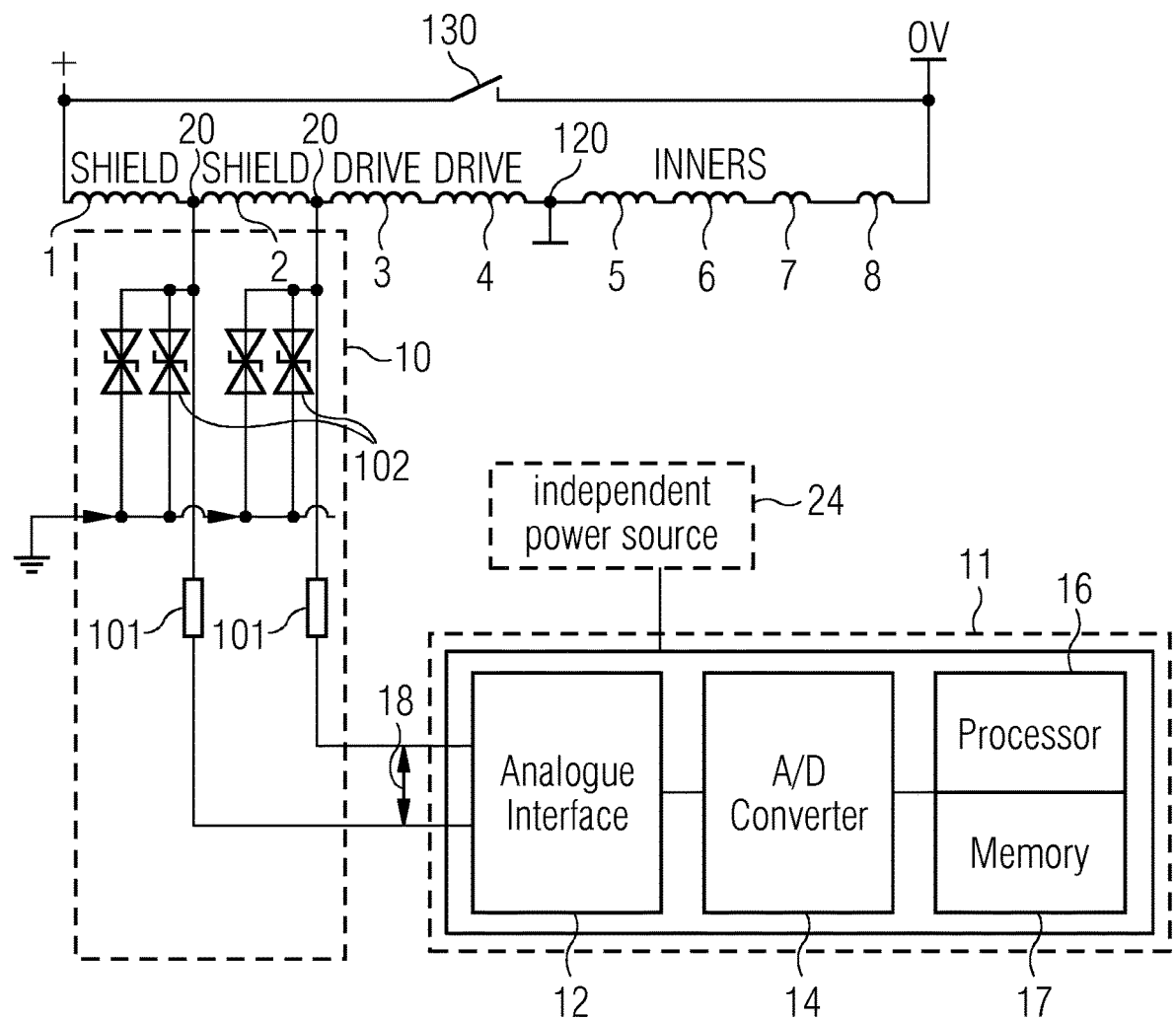
FIG. 1 represents a schematic overview of a diagnostic interface according to an embodiment of the present disclosure.

FIG. 1 illustrates an example embodiment of an anomaly detection system of the present disclosure. A diagnostic interface 10 may be connected to a data acquisition system 11, which may comprise an analogue interface 12 for signal conditioning, an analogue to digital converter 14 for providing a digital representation of the voltage received from the diagnostic interface 10, a processor 16 for subsequent processing of the digital representation and a memory 17 for storage of the digital representation. Processor 16 may be any suitable processing device such as a microcontroller and may incorporate memory 17. The processor 16 may be programmed such that data capture and analysis is triggered based on values of voltage signals 18 from the diagnostic interface 10.

In the embodiment of the disclosure illustrated in FIG. 1, the magnet includes shield coils 1, 2, drive coils 3, 4 and inner coils 5, 6, 7, 8 all connected in series. A ground potential 120 may be connected partway along this series connection. A superconducting switch 130 acts to close a superconducting circuit such that the magnet may operate in persistent node. With the superconducting switch open, a DC current may be introduced from the voltage terminals identified as 0 v and +.

According to a feature of this embodiment, tap points 20 are identified at certain points in the superconducting circuit, in this example being at terminations of a shield coil 2. This may be preferred as the shield coils may be more susceptible to external interference than the drive coils 3, 4 or the inner coils 5-8. Shield coils 1, 2 are typically closest to the external surface of the magnet, and are themselves unshielded and so are susceptible to disturbances.

No dedicated sensors are provided in the embodiment of FIG. 1. The diagnostic interface 10 is connected to tap points 20 and to the data acquisition system 11. The diagnostic interface 10 receives voltages from the tap points 20 and carries those voltages to data acquisition system 11. Diagnostic interface 10 may comprise current limiting resistors 101 and voltage limiting devices 102 to ensure that the voltage and current supplied to the data acquisition system 11 remains within tolerable limits. A resistor network may be added in parallel with voltage limiting devices 102 to provide voltage scaling. The voltage 18 applied to the data acquisition system accordingly represents the voltage across shield coil 2, and may be assumed to be representative of coil voltages within the magnet system. As will be explained in more detail below, variations in coil voltages may indicate that a mechanical impact has occurred. Analysis of the variation in voltages at the tapping points 20 may further indicate the type and severity of the impact.

Introduction of a ferromagnetic object moving in the magnetic field of the magnet induces a voltage within the magnet coils. These induced voltages appear at tap points 20 discussed above, and so are carried to the data acquisition system 11. As the coils are superconducting, these voltages are transient and are induced as a result of the rate of change of flux due to the interaction of the ferromagnetic material coupling with the magnet coils (Faraday's Law). The mutual induction of the coil set defines how this induced voltage is coupled into the other coils. By monitoring such voltages at the coils, the presence of movement of an object may be detected. Where an object makes a mechanical impact to a magnet system, the resulting mechanical vibration of the coil will induce further voltage disturbances.

In addition to detection of impact by ferromagnetic objects, variants of the present disclosure may be adapted to detect mechanical impact of non-ferrous materials, or indeed large vibrations due to earthquakes etc. A mechanical impact to the magnet system will cause mechanical oscillation of components, such as the coils, thermal radiation shields, cryogen vessel, within the magnetic field of the magnet. Such oscillation within the magnetic field will generate currents, either directly in the coils or as eddy currents in the respective components, which eddy currents then generate their own magnetic fields, which in turn cause corresponding voltages to be induced in the coils. Those voltages will appear at the tap points 20 and will therefore be detected by the diagnostic interface 10 in the same manner as voltage variations caused by impact of ferromagnetic objects.

In the illustrated embodiment, the diagnostic interface 10 includes electrical connections 20 direct to terminals of magnet coils. Very high voltages may be observed at such locations, for example during a magnet quench. The current and voltage limiting functions may be provided within the diagnostic interface 10 such that excessive values are not seen external to the magnet. This may be achieved by providing voltage limiting devices 102 and current limiting devices 101 on a circuit board carrying the diagnostic interface 10. In the embodiment shown in FIG. 1, voltage limiting devices 102 are provided between each tap point 20 and a ground voltage. Current limiting devices 101 such as resistors are provided between the tap points 20 and the data acquisition system 11.

In case of an object striking the magnet, voltage oscillations will occur between tap points 20 of the magnet. These may be due to mechanical oscillation of the magnet coils within their magnetic field caused by a mechanical impact, or due to electric currents induced in the coils by eddy currents in thermal shields, those eddy currents in turn being caused by mechanical oscillations of the thermal radiation shield, in turn caused by a mechanical impact to the system.

The data acquisition system 11 receives the variations in voltages at the tap points 20, suitably limited in voltage and current, and converts them 14 into digital representations thereof for storage 17 and processing 16.

In embodiments of the present disclosure, the processor 16 monitors the acquired data in real time. In response to a variation in a monitored voltage 18 which breaches a certain predetermined threshold, data capture is triggered and data representing measurements of the monitored voltage 18 are stored in memory. Subsequent processing of the stored data can determine the nature of the event, as will be explained in more detail below.

The diagnostic interface 10 and data acquisition system 11 of the present disclosure may also, or alternatively, be used to capture coil information during a magnet quench due to any reason: either caused as a result of an impact of an object, or as a separate event due to either an emergency rundown control being activated or due to unexpected quench of the system, or even during planned service intervals.

Figure 2:
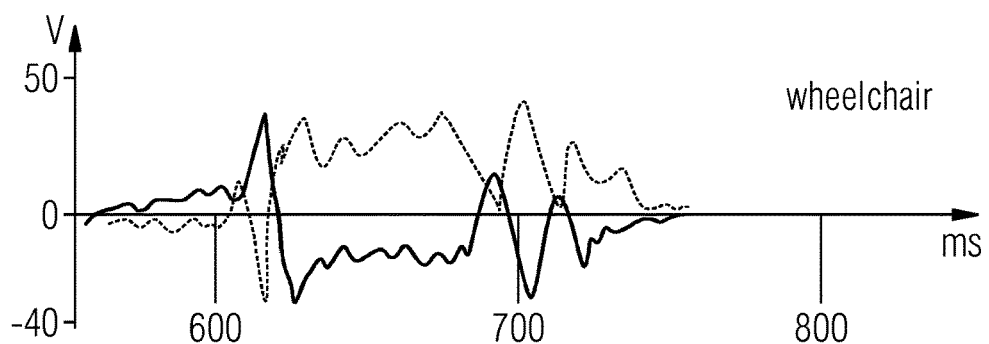
FIG. 2 shows data representing coil voltages in response to a first impact.

FIG. 2 shows data representing coil voltages 18 at the tap points 20 captured during the mechanical impact of a wheelchair. In this example, the wheelchair had a mass of approximately 15 kg, of which at least 50% was ferromagnetic mass. The induced voltages in the shield coils peak at about 40V during the impact. By the very nature of such an impact, the impact occurs at one end of the system as the object is too large to enter the bore of the magnet. This asymmetry is observed in that the voltages in the shield coils diverge with opposing polarities but similar magnitude, which may be taken to indicate an asymmetrical impact of an object too large to enter the bore of the magnet.

Regarding the impact of the wheelchair, represented in FIG. 2, the extended period of voltage detection from the system is as a result of the wheelchair collapsing. In this event the wheelchair initially strikes the vessel, represented by the initial voltage rise, but then proceeds to collapse into the entrance of the bore of the magnet over a period of time.

For the purposes of evaluation, various mechanical shock sensors were placed on the covers and vacuum vessel of the magnet system to assess and potentially calibrate the readings from the data acquisition system of the present disclosure. In use, certain embodiments of the present disclosure may also include such mechanical shock sensors, to provide another indication of a mechanical impact, and voltages or other outputs from mechanical shock sensors may be analogue-to-digitally converted if necessary, then supplied to the processor 16. An example of such an embodiment will be discussed below with reference to FIG. 7.

Figure 3:
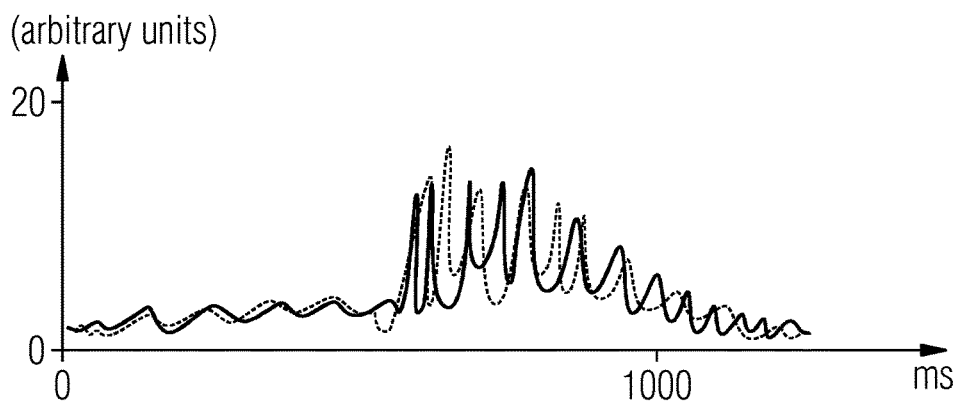
FIG. 3 shows data representing mechanical shock in response to the first impact.

FIG. 3 shows the data captured from the mechanical shock sensors during the wheelchair strike, in arbitrary units. Such data may be compared with the data indicating voltage variations at the tap points due to the same impact, as shown in FIG. 2. Such comparison provides reassurance that the variations in coil voltages represented in FIG. 2 do indeed represent a mechanical impact.

Figure 4:
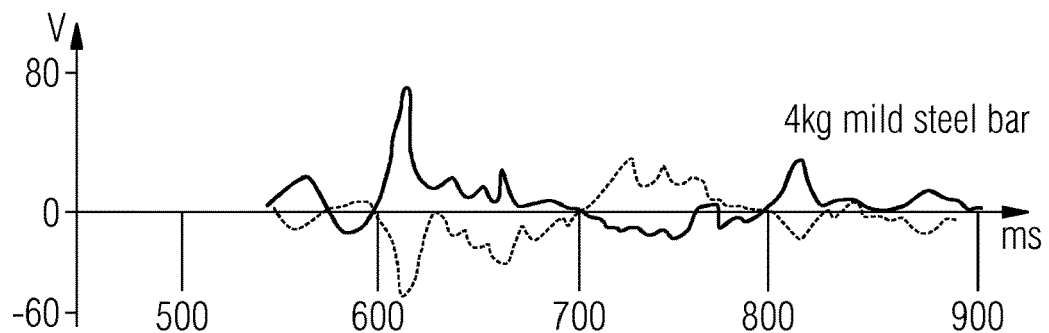
FIG. 4 shows data representing coil voltages in response to a second impact.
Figure 5:
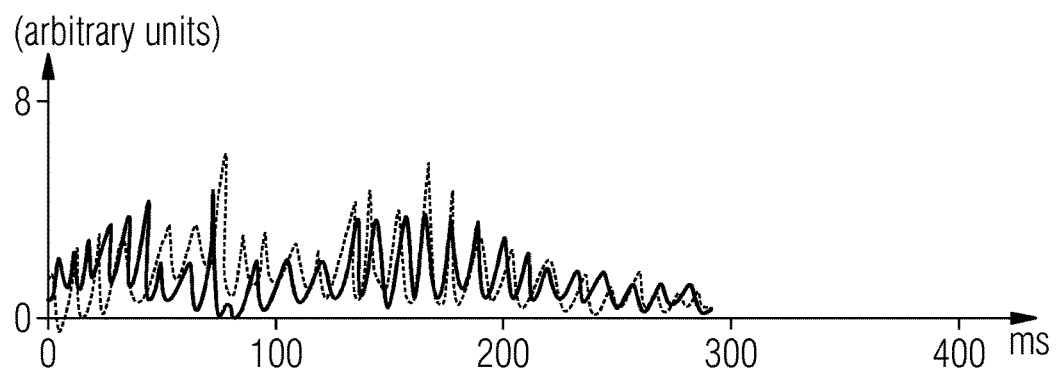
FIG. 5 shows data representing mechanical shock in response to the second impact.

FIG. 4 shows a data trace indicating coil voltage 18 variations at the tap points 20 due to an impact of a 4 kg ferromagnetic object, in this case a mild steel bar, which could represent a toolbox with standard tools for example, which travels into the bore of the magnet. The corresponding independent vibration monitoring data from the mechanical shock sensors is shown in FIG. 5, in arbitrary units. The data illustrated in FIGS. 4 and 5 are accordingly comparable to the data shown in FIGS. 2 and 3, but differ because the 4 kg bar is able to enter the bore of the magnet. The impact is not a single event, but lasts over a longer period of time and has a less sharp initial effect. The initial event is one of oscillation, as the object is drawn into the magnet, travels through the bore of the magnet and out the other side, then re-enters the bore and mechanically impacts the magnet.

The differences in data, both from the mechanical shock sensors and the tap point 20 voltages 18 are clear enough to demonstrate that a type of impact can be determined by analysis of the data representing the tap point 20 voltage 18 variation, as is provided in certain embodiments of the present disclosure.

As described earlier, the data acquisition system 11 and the diagnostic interface 10 of the anomaly detection system of the present disclosure are capable of capturing coil information during a quench, by recording and analysing voltages 18 appearing at the tap points 20. By extension, in certain embodiments of the present disclosure, it is possible to use the system to trigger deliberate quenches. This may be arranged to happen automatically, in that a system controller may identify the detection of a mechanical impact or magnetic disturbance and automatically initiate quench. Such quench-activating capability may enable a magnet designer to further optimize material and magnet properties in a magnet design since the magnet remains protected under spontaneous quench conditions, as a quench may be instigated automatically should magnet operation stray outside its desired range of parameters.

A passive quench arrangement may use a voltage derived across magnet coils to apply to quench heaters. For example, a 20-30V voltage derived across one or more coils of the magnet may be scaled by resistors to provide a suitable voltage for inducing a quench by conventional quench heaters. In this way, a derived voltage may be chosen that represents a significant mechanical impact, and the derived voltage may be scaled so that a quench is propagated passively in response to the mechanical impact. Active quench may be required to protect the magnet in cases where passive quench will not activate fast enough, for example due to a cost-optimised magnet design in which a superconducting wire is chosen with a reduced copper content, which reduces system costs but also reduces the ability of the wire to withstand local heating in case of a quench. To reduce local heating, fast active quench propagation may be provided to limit the maximum temperature reached during a quench.

In an example embodiment, a thresholding step is included. For example, the thresholding may require a coil voltage disturbance to be detected which peaks above a threshold value, typically several volts. This may enable the mechanical impact to be classified as a significant impact having the ability to cause damage to the magnet system or an insignificant impact unlikely to cause damage to the magnet system. Such thresholding may be achieved passively, as described above, by scaling the derived voltage such that a quench is passively propagated in response to the derived voltage. Alternatively, in an active quench propagation arrangement, a threshold may be set in software, or in a hardware implementation, to indicate to a controller that a significant impact has occurred. The controller may then initiate quench propagation in response.

A passive quench propagation arrangement requires energy for quench heaters to be drawn from coil current. There is a delay in that quench must commence, and the magnetic field of the magnet must begin to collapse in order to allow current to be induced in the propagation circuit for quench heaters. This may be found to be a relatively slow process, taking hundreds of milliseconds before a quench heater receives enough energy to commence quench propagation. With active propagation, detection of a mechanical impact, by detection of a large coil voltage, may be almost instantaneous, and current may be supplied from a controller to quench heaters very rapidly. This will reduce the maximum temperature reached in the quenching coil as the quench will be propagated throughout the magnet more rapidly.

In some embodiments, an evaluation may be performed to determine whether the coil voltage disturbance exceeds the threshold value for a certain duration, typically several milliseconds. Such criteria may be used to categorise the type of mechanical. For example, in comparing the coil disturbance voltages of FIG. 2 and FIG. 4, it can be seen that the coil disturbance of FIG. 2 remains high over an extended period of time, while the coil disturbance voltage of FIG. 4 only briefly reaches high values.

Such parameters of peak coil voltage disturbance value and duration of the peak coil voltage disturbance value may be taken into account in determining whether a magnet quench should be initiated.

Figure 6:
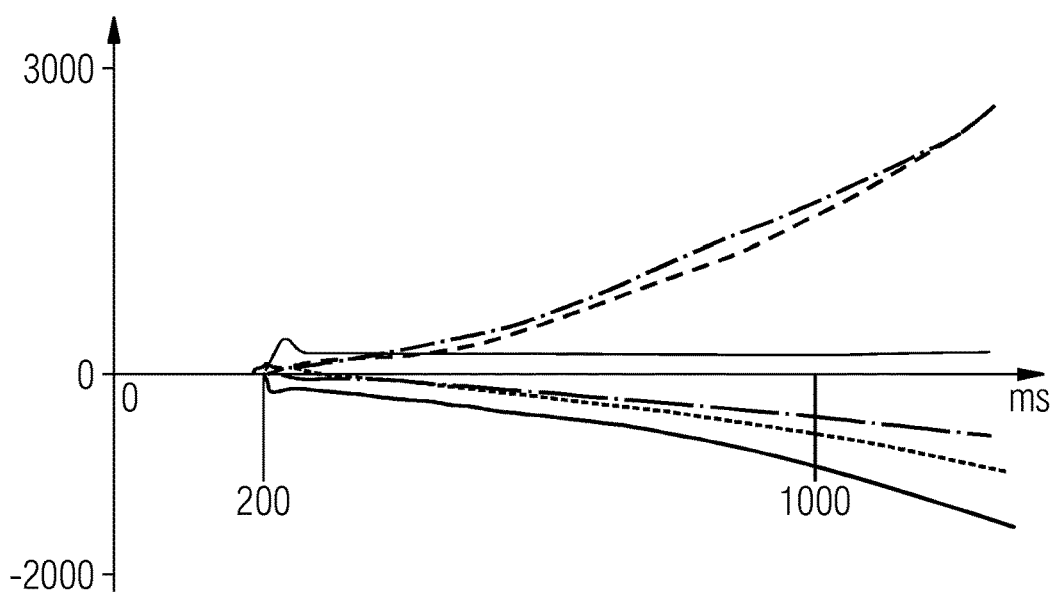
FIG. 6 shows data representing coil voltages in response to an intentional quench.

FIG. 6 illustrates voltages at certain tap points 20, at the superconducting switch and at various coil terminations, during a deliberate quench. The voltage variation may be seen to be very different from any variation brought about by mechanical impact or magnetic interference with the system.

In certain embodiments of the present disclosure, a data acquisition system 11 receives information from the diagnostic interface 10 and also receives input from other sensors. In an example, schematically represented in FIG. 7, this may include a vibration sensor 22 for example a MEMS based sensor, which in combination with the diagnostic interface 10 could be used to add further discrimination in the identification of the types of impacts that the system endures.

The system and method of the present disclosure may be sufficient to detect that an impact of some sort has occurred, or to detect some other interference with a magnetic field of a magnet system, but it may require the expertise of a human technician to deduce the type of impact or other event likely to have occurred. In the present description, example voltage and acceleration traces are discussed, and certain typical characteristics are presented. With accumulated knowledge, and by comparison with such example traces, a technician may deduce a type of impact indicated by a given voltage and/or acceleration trace, acquired from a magnet system in response to a service request. A data storage memory should be provided, so that data indicating a mechanical impact may be preserved. In an example, a rolling short-term memory may store all voltage and/or acceleration sensor data, and the contents of that rolling short-term memory may be preserved in long term memory in response to the detection of a mechanical impact or other disturbance according to a method of the present disclosure.

For example, it is quite normal for the magnet system to receive minor impacts for example from patient table docking. It is important to be able to distinguish such banal impacts from impacts which may have caused damage to the system. A vibration sensor 22 such as proposed here may assist in distinguishing the type of impact which has been undergone by the magnet system. During operation of the MRI system, access tends to be closely supervised. The present disclosure addresses the issue of detecting and recording events which occur when the MRI system is not in use. This criterion may be embodied in embodiments of the present disclosure which provide detection and analysis only of impact events which occur when gradient coils are inactive. Such arrangement would also ensure that detected transient coil voltages are not due to gradient field effects. Impact detections resulting from patient table operation may be excluded from consideration either by characterisation of the resultant voltages, or by filtering with respect to the timing of operation of the MRI system. Induced voltages due to impacts resulting from docking of the patient table may, in any case, be below the threshold value. In certain embodiments, a three-axis sensor may be used to detect vibrations resulting from mechanical impacts. In such embodiments, it should be possible to distinguish vibrations resulting from patient table movement.

Figure 7:
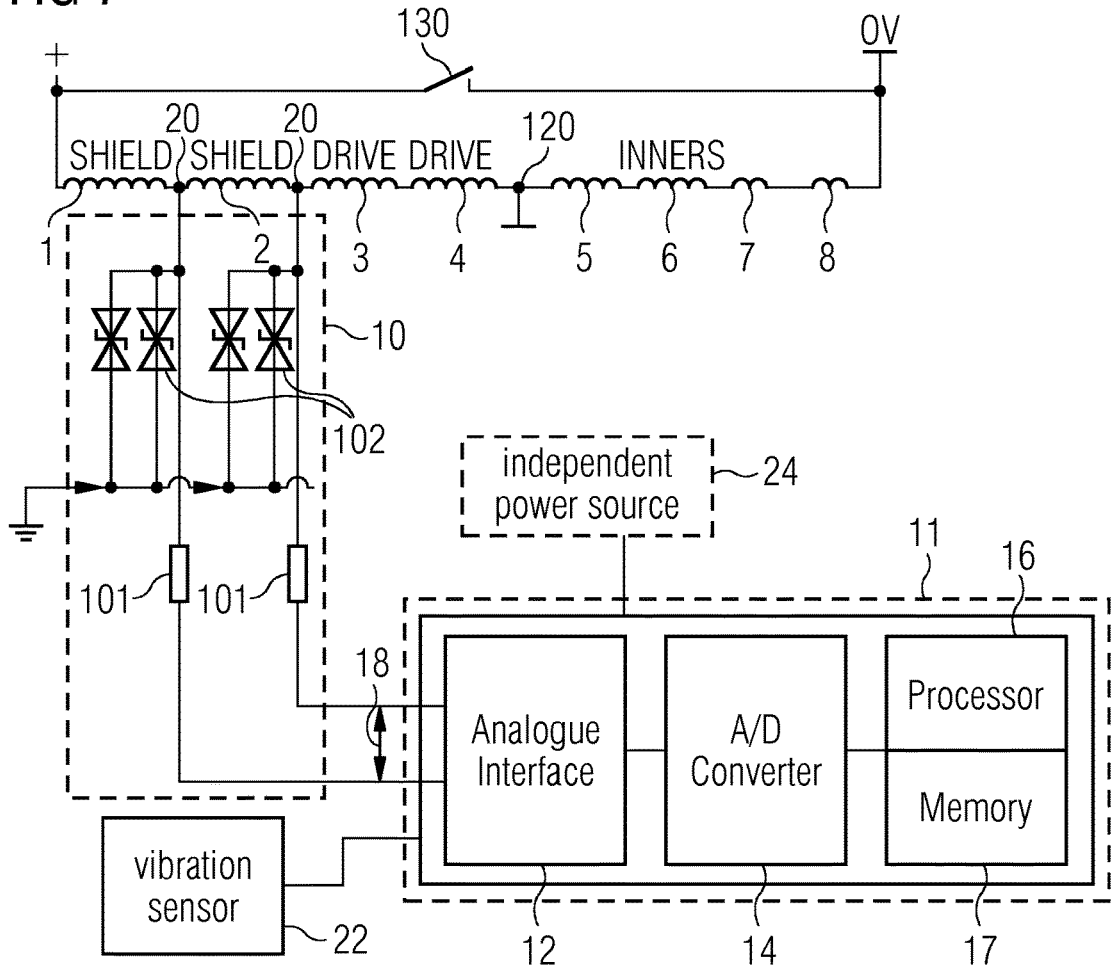
FIG. 7 represents a schematic overview of a diagnostic interface according to another embodiment of the present disclosure.

Impacts from large ferromagnetic objects are the most likely type of impact to cause damage to the system. These would be categorised as having induced large voltages both due to mechanical impact and interference with the magnetic field and corresponding activation of the vibration sensor 22 (FIG. 7). Impacts from routine operations such as docking the patient table which is designed not to be ferromagnetic, will only induce voltages as a result of the impact, for example by causing a magnet's own cryogenic 50K shield to move within the constraints of the magnet suspension system, generating much lower induced voltages. The inventor has found examples of hitting the magnet system with blocks of wood typically generating a lower voltage, such as 10-20V and the resulting vibrations oscillate and decay with a corresponding natural frequency. Events such as docking of a patient table are likely to be repeatable. If a three-axis motion detector is used, a patient table docking operation will always show a strong peak in one particular axis.

Another event that occurs is that, in normal operation, varying magnetic fields generated by a gradient coil of an MRI system induce voltages in the magnet coils. These voltages are however typically lower, such as approximately 20V, and are characterised by equal and opposite voltages generated either side of the magnet centre line and therefore sum to zero. Analysis of the induced voltages would therefore enable these events to be identified and excluded from any analysis of mechanical impacts or magnetic interference from external objects.

In certain embodiments of the present disclosure, an independent power source 24 (FIGS. 1, 7) may be provided for the data acquisition system 11. In which case, the vibration sensor 22 employed in certain embodiments may enable data logging of impact events during transportation with the magnet de-energised, not caused by attraction of objects by the magnetic field of the magnet. Where a magnet is transported at field, the diagnostic interface of the present disclosure may be used as fully described, recording any mechanical impacts by measuring a voltage 18 across tap points 20.

The data acquisition system 11 and diagnostic interface 10 as described may be embodied as a standalone solution or may be integrated as part of a control system such as that known as a Magnet Supervisory (MSUP).

The estimated cost of adding a diagnostic interface 10 and data acquisition system 11 of the present disclosure to a magnet system has been estimated at about 60 euro. In terms of financial benefit, the inventors estimate that many thousands of euro may be saved annually in unjustified warranty claims if the diagnostic interface as described is fitted to all MRI systems and used to determine whether detected impacts result from events outside of the terms of a warranty. Even where no damage is caused, such as due to interference with an imaging magnetic field from a nearby object, the expense of unjustified warranty service visits may be avoided.

The present disclosure accordingly provides an anomaly detection system comprising a diagnostic interface 10 and a data acquisition system 11 capable of recording data indicating variation of voltages at tapping points 20 in a superconducting magnet. Data representing those variations in voltages may be stored as a data log and a processor may analyse the data in order to identify the cause of the variations in voltage: typically, these may be identified as significant mechanical impact from object of mass exceeding a threshold value;

significant mechanical impact from object of mass not exceeding the threshold value;

banal mechanical impact; or interference in a magnetic field due to a nearby object, not resulting in a mechanical impact.

Such classification of anomalies may be performed by evaluating characteristics of the detected voltage variation. For example, data representing coil voltages and/or other properties such as acceleration sensors may be evaluated by trained technicians to deduce the likely type of mechanical impact to other anomaly that has occurred. Some automation of this evaluation may be possible, according to suitable test criteria which will be discussed below. Further identification may be provided by supplementary sensors such as mechanical vibration sensors.

Such classification of impacts may be performed, with suitable signal processing to distinguish between events. In certain embodiments, detection of a possible mechanical impact or other anomaly may be triggered once the coil disturbance voltage detection system peaks above a threshold, for example of around 30 V for a certain duration of time, for example several milliseconds. Such detection may occur with reference to either a single or multiple coils. Data representing the detected waveforms may be captured for analysis. In certain embodiments, multiple detection points may be chosen to trigger an intentional quench.

Once the waveform data have been captured, the data may be transmitted back to the manufacturer of the MRI system or another service provider, typically over the internet or by a mobile telephone network. Alternatively, the data could be accessed during a service visit to site.

An analysis of the data could then be performed to identify a type of anomaly which has occurred, for example by magnitude of peaks of voltage or acceleration or other measured characteristic, nature of an impact at one end characterised by a peak signal and rapid decay, indications of an object dragged into the bore of magnet characterised by a peak transient followed by a sustained level for a duration, or indications of objects entering the bore of the magnet showing an oscillation from one end of the magnet to the other before attaching to the bore, characterised in a periodic signal of strong fundamental frequency.

Figure 10A:
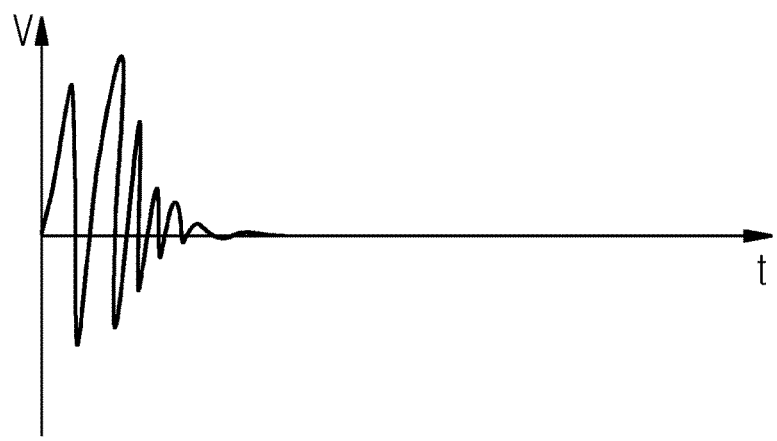
FIGS. 10A and 10B illustrate respective derived coil disturbance voltages.
Figure 10B:
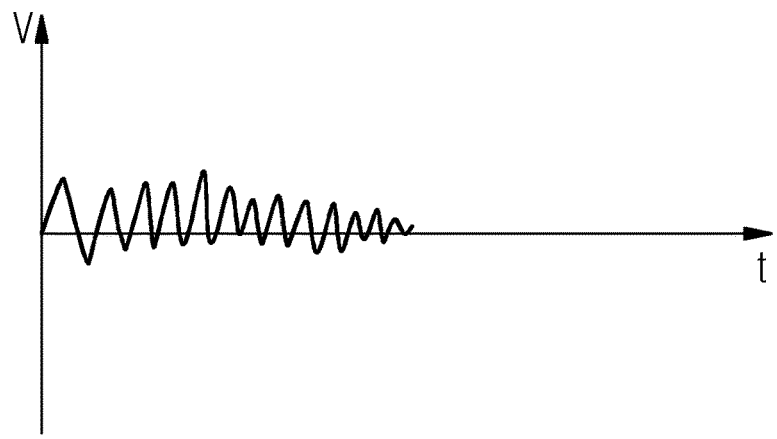
Figure 10C:
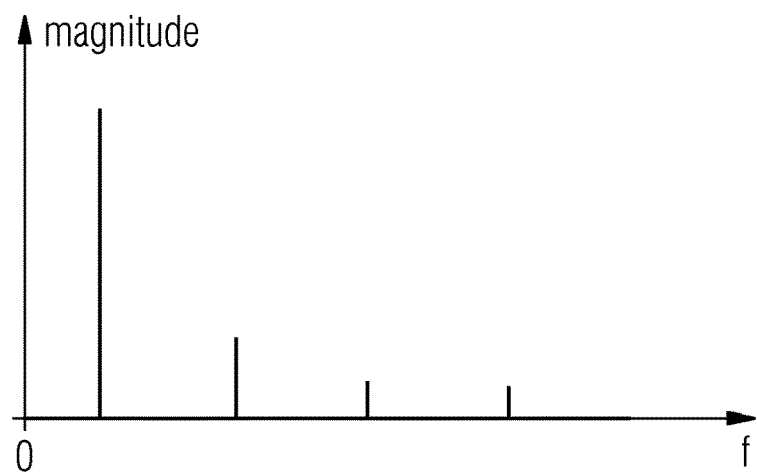
FIG. 10C represents a result of a Fourier analysis on a coil disturbance voltage and reveals a relatively high magnitude of fundamental frequency.

An example test could be in measuring the peak value of derived coil voltage and comparing it to the length of time elapsed between a time at which a derived coil voltage first traverses a threshold in response to a mechanical impact and the time at which the derived coil voltage finally traverses that threshold in response to that mechanical impact. For example, FIG. 10A illustrates what may be a typical derived coil disturbance voltage in the case of a large object (such as the gas cylinder mentioned herein) hitting the end of a magnet system. A large initial voltage is produced, and oscillations in the disturbance voltage rapidly reduce to a low level. FIG. 10B, on the other hand, represents a more prolonged impact, such as in the case of the wheelchair described herein. A smaller initial coil disturbance voltage is produced, and the oscillations in the coil disturbance voltage last for a longer time before reducing to a low level. FIG. 10C represents a result of a Fourier analysis on a coil disturbance voltage and reveals a relatively high magnitude of fundamental frequency. Such result may indicate an object entering the bore of the magnet and showing an oscillation from one end of the magnet to the other before attaching to the bore. The Fourier analysis reveals a periodic signal of strong fundamental frequency.

A relatively crude indication along the lines of "magnet impact likely to have occurred" may be able to be detected by counting number of transients in coil disturbance voltage above certain thresholds and measuring a periodicity of these to give an initial assessment. This assessment may be carried out by a suitably trained technician. A more automated approach may involve automated pattern matching of the waveform data.

In case a user calls the manufacturer or other support organisation for a repair or service of a magnet system, then the manufacturer or other support organisation can examine the logged data to investigate whether the magnet system has suffered any mechanical or magnetic events which may have caused the system to require the requested repair or service. Typically, if data has been logged which indicates that the magnet system has undergone a significant mechanical impact, then any consequential repair or service operations may not be covered by a warranty. Alternatively, if data has been logged which indicates that the magnet system has undergone a disturbance to a magnetic field due to proximity of an article interfering with the magnetic field, a service visit may be avoided by explaining the issue to an operator, such that the operator may identify and remove the article causing the disturbance to the magnetic field.

The diagnostic interface and the data acquisition system of the present disclosure provides suitable analysis of signals acquired, representing voltage variation and tapping points, and/or mechanical impacts. Such analysis can determine that an object has impacted with the MRI system, for example. The magnitude of the impact may be estimated, and the likely resulting damage may be estimated in preparation for planning a service visit. The advantage of such a system is that disputes that may occur regarding warranty or service claims with the manufacturer can be resolved in an expedient manner such that unnecessary financial losses to the manufacturer or other service organisation are minimised.

Figure 8:
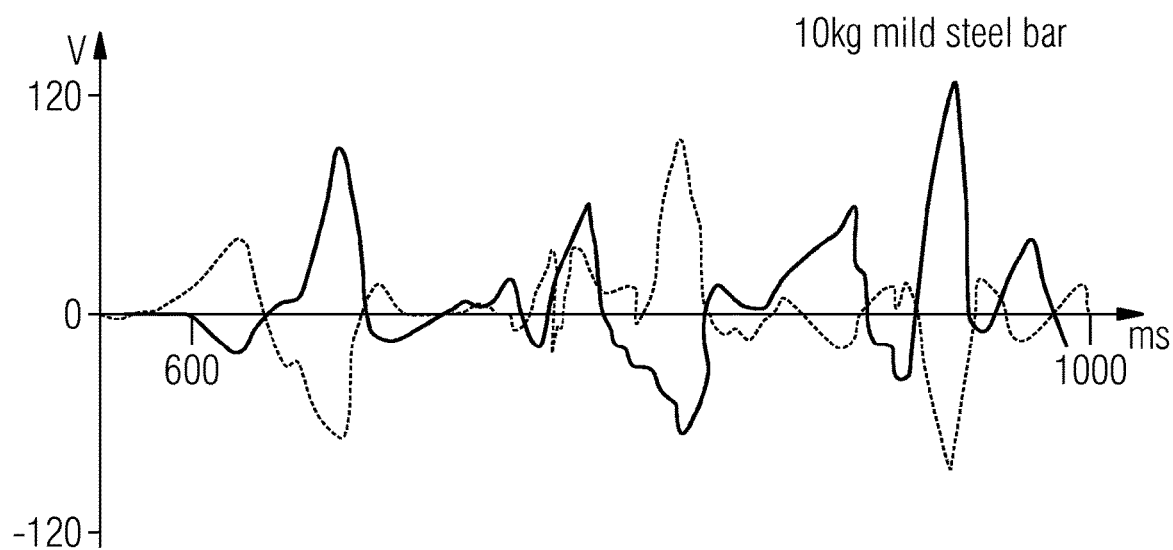
FIG. 8 shows data representing coil voltages in response to a third impact.

FIG. 8 represents detected coil disturbance voltages resulting from impact of a 10 kg mild steel bar. This enters the bore of the superconducting magnets and reacts with the magnet in a similar way to the 4 kg bar described above with reference to FIG. 4, but with much larger induced voltages. In the illustrated example, the coil voltage disturbance peaks at well over 100V.

Figure 9:
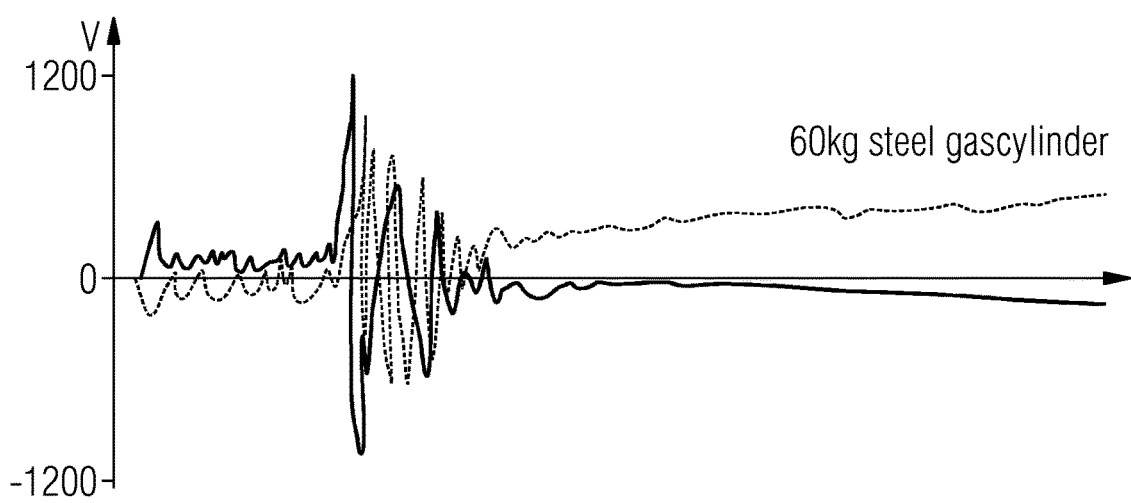
FIG. 9 shows data representing coil voltages in response to a fourth impact.

FIG. 9 represents detected coil disturbance voltages resulting from impact of a 60 kg gas cylinder. The gas cylinder is too large to enter the bore of the magnet, and hits the axial end surface of the magnet. The gas cylinder reacts in a somewhat similar manner to the wheelchair discussed with reference to FIG. 2, although the cylinder will not continue to deform after the initial impact, so the transient voltages will be of shorter duration, but with much larger induced voltages. The cylinder strikes a vacuum vessel containing the magnet and instantly stops as it is too large to enter the bore of the magnet. In the illustrated example, the coil voltage disturbance peaks at well over 1200V.

The impact of the gas cylinder example of FIG. 9 induces a magnet quench as can be seen from the rising coil voltages which continue at the end of the trace.

While the present disclosure has been specifically described with reference to a superconducting magnet as used in an MRI system, the present disclosure may be used with superconducting magnets in other types of system, and indeed with magnets employing resistive coils.

Although certain example embodiments have been discussed, it is important to note that detection and threshold values will be different for different magnet systems, so calibration of the detection system of the present disclosure will be required according to the magnet system in question. Voltage threshold levels should be determined for coil disturbance voltage oscillations at resonant frequencies of the magnet system in question. This may be done empirically for any given system, measuring voltage experienced with small voltages, then larger ones up to a required threshold object mass, and setting a corresponding threshold for induced voltage accordingly.

Methods of the present disclosure include methods for distinguishing a type of anomaly undergone by a magnet system by use of an adaptive threshold. By "adaptive threshold" here is meant a threshold whose value is determined by the magnitude of the voltage being measured. For example, a peak value of a coil disturbance voltage may be measured, and a threshold then set as a percentage of the peak value. A peak value of coil disturbance voltage may be measured. An adaptive threshold may be set, for example at 30% of the peak value, and a period of time may be measured from a first time that the coil disturbance voltage exceeds the adaptive threshold to a final time that the coil disturbance voltage exceeds the adaptive threshold. That period of time herein referred to as the "adaptive threshold period" may be used, in conjunction with an absolute value of the peak coil disturbance voltage and an absolute threshold to provide some automation of classification of impacts. In an example, the classification method may proceed as follows: if the coil disturbance voltage exceeds an absolute threshold value (e.g. 30V), for a time in excess of a time threshold, then an evaluation of the associated coil disturbance voltage may be triggered. The absolute value of the peak disturbance voltage is one characteristic which may be used to classify the detected impact. As discussed above, the example arrangement showed coil disturbance voltages of over 100V for impacts of heavy, rigid masses. This compares to much lower peak voltages of 40-50V for impacts by lighter and/or more compliant masses. If a peak coil disturbance voltage of 100V is measured, and adaptive threshold of 30% may be set—in this case, 30V. The "adaptive threshold period" may then be measured. As discussed above, the example arrangement showed a relatively short adaptive threshold period, for example of 25 ms for impacts of heavy, rigid masses. This compares to a much longer adaptive threshold period such as 180 ms for impacts by lighter and/or more compliant masses.

Taking the example coil disturbance voltages of FIGS. 2, 4, 8, 9 as examples:

FIG. 2 shows a coil disturbance voltage resulting from impact of a 15 kg wheelchair. The voltage first traverses a 30V absolute threshold of disturbance voltage at a time of about 620 ms. This may trigger evaluation of the disturbance voltage waveform. The peak disturbance voltage is about 42V, so an adaptive threshold of 30% may be set at 12.6V. As demonstrated in this drawing, opposing voltages may be detected on respective coils, so it may be more appropriate to set the respective thresholds at ±12.6V and ±30V. A first traverse of the adaptive threshold of ±12.6V occurs at about 590 ms, and a final traverse at about 730 ms, giving an adaptive threshold period of 140 ms. A ratio of peak disturbance voltage to adaptive threshold period may be calculated as 42/0.140 V/s=300 V/s.

FIG. 4 shows a coil disturbance voltage resulting from impact of a 4 kg mild steel bar. The voltage first traverses a 30V absolute threshold of disturbance voltage at a time of about 605 ms. This may trigger evaluation of the disturbance voltage waveform. The peak disturbance voltage is about 70V, so an adaptive threshold of 30% may be set at 21V. As demonstrated in this drawing, opposing voltages may be detected on respective coils, so it may be more appropriate to set the respective thresholds at ±21V and ±30V. A first traverse of the adaptive threshold of ±21V occurs at about 602 ms, and a final traverse at about 615 ms, giving an adaptive threshold period of 13 ms. A ratio of peak disturbance voltage to adaptive threshold period may be calculated as 70/0.013 V/s=5384 V/s.

FIG. 8 shows a coil disturbance voltage resulting from impact of a 10 kg mild steel bar. The voltage first traverses a 30V absolute threshold of disturbance voltage at a time of about 610 ms. This may trigger evaluation of the coil disturbance voltage waveform. The peak disturbance voltage is about 180V, so an adaptive threshold of 30% may be set at 54V. As demonstrated in this drawing, opposing voltages may be detected on respective coils, so it may be more appropriate to set the respective thresholds at ±54V and ±30V. A first traverse of the adaptive threshold of ±54V occurs at about 650 ms, and a final traverse at about 940 ms, giving an adaptive threshold period of 290 ms. A ratio of peak disturbance voltage to adaptive threshold period may be calculated as 180/0.290 V/s=621 V/s.

FIG. 9 shows a coil disturbance voltage resulting from impact of a 60 kg steel gas cylinder. The voltage first traverses a 30V absolute threshold of disturbance voltage at a time of about 570 ms. This may trigger evaluation of the coil disturbance voltage waveform. The peak disturbance voltage is about 120V, so an adaptive threshold of 30% may be set at 36V. As demonstrated in this drawing, opposing voltages may be detected on respective coils, so it may be more appropriate to set the respective thresholds at ±36V and ±30V. A first traverse of the adaptive threshold of ±36V occurs at about 570 ms, and a final traverse at about 610 ms, giving an adaptive threshold period of 40 ms. A ratio of peak disturbance voltage to adaptive threshold period may be calculated as 120/0.040 V/s=3000 V/s.

Another characteristic which may be measured is the proportion of the adaptive threshold period for which the coil disturbance voltage exceeds the adaptive threshold. In the case of the wheelchair example of FIG. 2, a large proportion of the adaptive threshold period has the coil disturbance voltage exceeding the adaptive threshold. In the case of the 10 kg mild steel bar example of FIG. 8, a very small proportion of the adaptive threshold period has the coil disturbance voltage exceeding the adaptive threshold.

These characteristics:
peak disturbance voltage,
adaptive threshold period, ratio of peak disturbance voltage to adaptive threshold period, proportion of the adaptive threshold period for which the coil disturbance voltage exceeds the adaptive threshold may accordingly be used to characterise a detected anomaly, particularly a mechanical impact.

Outputs from other sensors, such as acceleration sensors, may also be employed in characterising an anomaly.

For each magnet system, the absolute voltage threshold and time thresholds must be chosen appropriately. Although a threshold may be determined empirically, by measuring disturbance voltages generated by impact of selected objects, it is preferable to derive a suitable absolute voltage my modelling using one of the computer modelling systems which will be familiar to those skilled in the art.

The invention claimed is:

1. A method for detecting anomalies in voltages within a magnet system comprising series-connected current-carrying superconducting coils, comprising:
   receiving voltages from tapping points located electrically between superconducting coils within the magnet system;
   converting the voltages into digital representations of the voltages;
   storing the digital representations of the voltages;
   receiving signals from mechanical vibration sensors; and
   processing the digital representations of the voltages and the signals received from the mechanical vibration sensors to categorize a detected variation in the voltages at the tapping points,
   wherein the detected variation in the voltages at the tapping points is categorized to identify a cause of the variations in voltage as one of (i) a first type of mechanical impact, (ii) a second type of mechanical impact, or (iii) interference in a magnetic field due to a nearby object not resulting in a mechanical impact,
   wherein the storing the digital representations of the voltages and processing the digital representations of the voltages and the data received from the mechanical vibration sensors to categorize the detected variation in the voltages at the tapping points is performed in response to the detection of a voltage at the tapping points in excess of a voltage threshold which lasts for a duration of time in excess of a time threshold.

2. A method according to claim 1, wherein the voltage threshold is selected to differentiate impacts due to (i) magnetic attraction of an object having a mass exceeding a mass threshold that may mechanically impact the magnet system with an expectation of damage being caused, and (ii) magnetic attraction of an object having a mass that is less than the mass threshold.

3. A method according to claim 1, wherein the acts of storing the digital representations of the voltages and processing the digital representations of the voltages and the signals received from the mechanical vibration sensors to categorize the detected variation in the voltages at the tapping points further comprises determining whether the magnet system is in use in a magnetic resonance imaging (MRI) system.

4. A method according to claim 1, wherein the acts of storing the digital representations of the voltages and processing the digital representations of the voltages and the signals received from the mechanical vibration sensors to categorize the detected variation in the voltages at the tapping points further comprises determining whether the voltages from the tapping points are symmetrical such that the voltages are equal and opposite voltages generated at either side of a magnet center line associated with the magnet system and sum to zero.

5. A method for detecting anomalies in voltages within a magnet system comprising series-connected current-carrying superconducting coils, comprising:
   receiving voltages from tapping points located electrically between superconducting coils within the magnet system;
   converting the voltages into digital representations of the voltages;
   storing the digital representations of the voltages; and
   processing the digital representations of the voltages to calculate a periodicity of time identified with successive instances in which a coil voltage disturbance value is in excess of a voltage threshold, and to categorize a detected variation in the voltages at the tapping points based upon the periodicity of time to identify the cause of the variations in voltages as one of (i) a first type of mechanical impact, (ii) a second type of mechanical impact, or (iii) interference in a magnetic field due to a nearby object not resulting in a mechanical impact.

6. A method according to claim 5, wherein the act of processing the digital representations of the voltages to categorize the detected variation in the voltages at the tapping points comprises determining whether the magnet system is in use in a magnetic resonance imaging (MRI) system.

7. A method according to claim 5, wherein the act of processing the digital representations of the voltages to categorize the detected variation in the voltages at the tapping points comprises determining whether the voltages from the tapping points are symmetrical such that the voltages are equal and opposite voltages generated at either side of a magnet center line associated with the magnet system and sum to zero.

8. The method of claim 5, wherein the voltages received from the tapping points located electrically between superconducting coils within the magnet system comprise voltage oscillations as a result a mechanical impact, and
   wherein the act of processing the digital representations of the voltages to calculate the periodicity of time comprises calculating a periodicity of time based upon the voltage oscillations.

9. A method for characterising mechanical impacts to a magnet system that is used as part of a magnetic resonance imaging (MRI) system, comprising:
   receiving power from an independent power source that is separate from the MRI system to power a data acquisition system;
   via the data acquisition system:
      receiving signals from one or more vibration sensors attached to the magnet system;
      converting the signals into digital representations of the signals;
      storing the digital representations of the signals; and
      processing the digital representations of the signals to categorize a detected vibration,
   wherein the detected vibration is categorized to identify a cause of the vibrations while the magnet system is not in use in the MRI system as one of (i) a first type of mechanical impact, (ii) a second type of mechanical impact, or (iii) interference in a magnetic field due to a nearby object not resulting in a mechanical impact.

10. A method according to claim 9, wherein the magnet system comprises a superconducting magnet, and further comprising:

initiating quench of the superconducting magnet in response to the detected vibration or a detected coil voltage disturbance.

11. The method of claim 9, further comprising:

receiving voltages from tapping points located electrically between superconducting coils within the magnet system;

converting the voltages into digital representations of the voltages;

storing the digital representations of the voltages; and processing the digital representations of the voltages and the signals received from the one or more vibration sensors to categorize the detected vibration.

\* \* \* \* \*